United States Patent [19]

Yamamoto

[11] 4,181,890

[45] Jan. 1, 1980

[54] APPARATUS FOR RECEIVING SIGNALS IN PLURAL FREQUENCY BANDS

[75] Inventor: Kenji Yamamoto, Kashiwa, Japan

[73] Assignee: Sony Corporation, Tokyo, Japan

[21] Appl. No.: 923,621

[22] Filed: Jul. 11, 1978

[30] Foreign Application Priority Data

Jul. 12, 1977 [JP] Japan .................................. 52-82612

[51] Int. Cl.$^2$ ............................................. H04B 1/26
[52] U.S. Cl. ..................................... 325/316; 325/459
[58] Field of Search ............... 325/302, 304, 306, 315, 325/316, 317, 456, 458, 459, 303, 312

[56] References Cited

U.S. PATENT DOCUMENTS

| 3,206,679 | 9/1965 | Miller | 325/302 |
| 3,755,743 | 8/1973 | McLernon | 325/459 |
| 3,777,288 | 12/1973 | Fujita et al. | 325/459 |

Primary Examiner—Marc E. Bookbinder

Attorney, Agent, or Firm—Lewis H. Eslinger; Alvin Sinderbrand

[57] ABSTRACT

Radio receiving apparatus for receiving signals in plural frequency bands. Plural signal processing channels are provided, each channel being associated with a respective frequency band and each being tunable to different frequencies within its associated band to derive information signals when tuned to broadcast frequencies. Depending upon which of the signal processing channels is tuned to a broadcast frequency, a controllable switch connects that channel to an output circuit so as to supply the derived information signals thereto. A pulse generator generates intermittent pulse signals when the tuning condition of at least one of the signal processing channels is changed. These pulse signals are used to sample the tuning condition of that signal processing channel to determine if that channel is tuned to a broadcast frequency. A switch control circuit controls the switch to connect to the output circuit the particular signal processing channel which is tuned to a broadcast frequency.

6 Claims, 2 Drawing Figures

APPARATUS FOR RECEIVING SIGNALS IN PLURAL FREQUENCY BANDS

BACKGROUND OF THE INVENTION

This invention relates to apparatus for receiving signals in plural frequency bands and, more particularly, to a radio receiver which is tunable to different broadcast frequencies which are included in different frequency bands, such as the AM band, the FM band, and the like.

It is known to provide a radio receiver with the capability of being tuned to different frequencies in various frequency bands. For example, included within one housing, are different processing channels, each being associated with a particular frequency band, and each being tunable to different broadcast frequencies which are included in its associated band. As examples, a radio receiver may be provided with an AM channel capable of receiving and processing information which is broadcasted in the range of from about 535 KHz to about 1650 KHz, an FM channel which is capable of receiving and processing information broadcasted over a range of from about 88 MHz to about 108 MHz, and additional channels capable of receiving and processing information in a mobile band, a radio navigation band, a TV transmission band including VHF and UHF frequencies, and the like. In such a multi-band radio receiver, the particular frequency band over which the apparatus is tuned generally is selected by a suitable band selection switch or other control mechanism. In addition, the particular broadcast frequency in the selected frequency band to which the apparatus can be tuned generally is controlled by a tuning knob, channel selector switches, or the like.

In a typical multi-band receiver, separate tuners are provided for the respective frequency bands. Thus, and with respect to the AM and FM frequency bands, an AM tuner and an FM tuner are provided. A common tuning control device, such as the aforementioned tuning knob, is provided to change simultaneously the tuning conditions of both the AM and FM tuners. In such a construction, the AM tuner is included in an AM processing channel, which may include an intermediate frequency (IF) amplifier and an AM detector, and the FM tuner is included in an FM processing channel, which may include an IF stage, an FM detector and a demultiplexing arrangement. The band selection switch, in such a multi-band radio receiver, has an operating condition, or setting, associated with each processing channel. Thus, depending upon the operating condition, or setting, of the band selection switch, the information which is derived by one of the processing channels is selected to be connected to an output circuit, such as a sound transducer, a recorder, or the like. That is, if the AM band is selected, the selection switch connects the AM processing channel to the output circuit. Similarly, if the FM band is selected, the selection switch connects the FM processing channel to the output circuit. Also, if a VHF or UHF band (for example, for reproducing or recording TV sound, i.e., the sound information which accompanies a television signal) or if a mobile band is selected, the selection switch couples the appropriate processing channel to the output circuit.

In the multi-band radio receivers of the aforementioned type, all of the signal processing channels operate simultaneously, even though only one of such channels is selected to be connected to the output circuit. In a simple embodiment wherein the radio receiver includes only an AM channel and an FM channel, both channels operate simultaneously so as to enable suitable detecting circuitry to detect which of such channels is tuned to a broadcast frequency. Based upon this detection, apropriate channel selection can be made. For example, if the FM channel is tuned to a broadcast FM frequency, then the band selection switch is maintained in its operative condition, or setting, to connect the FM channel to the output circuit. Conversely, if the detection circuitry detects that the AM channel is tuned to a broadcast AM frequency, then the selection switch is maintained in its operative condition, or setting, to connect the AM channel to the output circuit. Unfortunately, since all of the processing channels are operating simultaneously, the operation of one may have a deleterious effect upon the operation of another. In the simple example wherein the radio receiver includes an AM channel and an FM channel, the IF signal produced by the IF stage in the FM channel will exert an undesired influence on the AM tuner and/or the AM channel. This means that if the AM channel is selected to be connected to the output circuit, the influence on this channel by the FM channel may distort the information which is recovered, or may render it difficult to obtain a desired tuning condition of the AM tuner, or may adversely affect the operation of the detection circuit, thereby making it difficult to detect when a broadcast AM frequency is being received.

OBJECTS OF THE INVENTION

Therefore, it is an object of the present invention to provide an improved multi-band radio receiver which avoids the problems and disadvantages attending multi-band radio receivers heretofore known.

Another object of this invention is to provide a multi-band radio receiver provided with plural processing channels, each associated with a respective frequency band, and wherein a particular channel automatically is connected to an output circuit if that channel is tuned to a broadcast frequency.

A further object of this invention is to provide a radio receiver which includes at least an AM processing channel and an FM processing channel, both tunable to selected frequencies in the AM and FM bands, respectively, and wherein the tuning condition of one of such channels, such as the FM channel, is sampled only when the tuning condition of the radio receiver is changed in order to determine when that channel is tuned to a broadcast frequency, and then to connect that channel to an output circuit.

An additional object of this invention is to provide a multi-band radio receiver including plural signal processing channels, each associated with a respective frequency band, and wherein all of the channels do not operate simultaneously, especially during a tuning operation, thereby avoiding deleterious influences of one channel upon another.

Various other objects, advantages and features of the present invention will become readily apparent from the ensuing detailed description, and the novel features will be particularly pointed out in the appended claims.

SUMMARY OF THE INVENTION

In accordance with the present invention, radio receiving apparatus is provided to receive signals which are broadcasted in plural different frequency bands. The radio receiving apparatus includes plural signal processing channels, each channel being associated with a respective frequency band, and each channel being tunable to different frequencies within its associated band so as to derive information signals from the received broadcasted frequency. A controllable switch connects a selected one of the processing channels to an output circuit under the control of a switch control circuit. A pulse generator generates intermittent pulse signals when the tuning condition of at least one of the signal processing channels is changed, and these pulse signals are used to sample the tuning condition of one of the signal processing channels to determine if that channel is tuned to a broadcasted frequency. If it is determined that this particular channel is tuned to a broadcasted frequency, then the switch control circuit is operated to direct the switch to connect that particular channel to the output circuit.

BRIEF DESCRIPTION OF THE DRAWINGS

The following detailed description, given by way of example, will best be understood in conjunction with the accompanying drawings in which.

DETAILED DESCRIPTION OF SOME PREFERRED EMBODIMENTS

Figure 1:
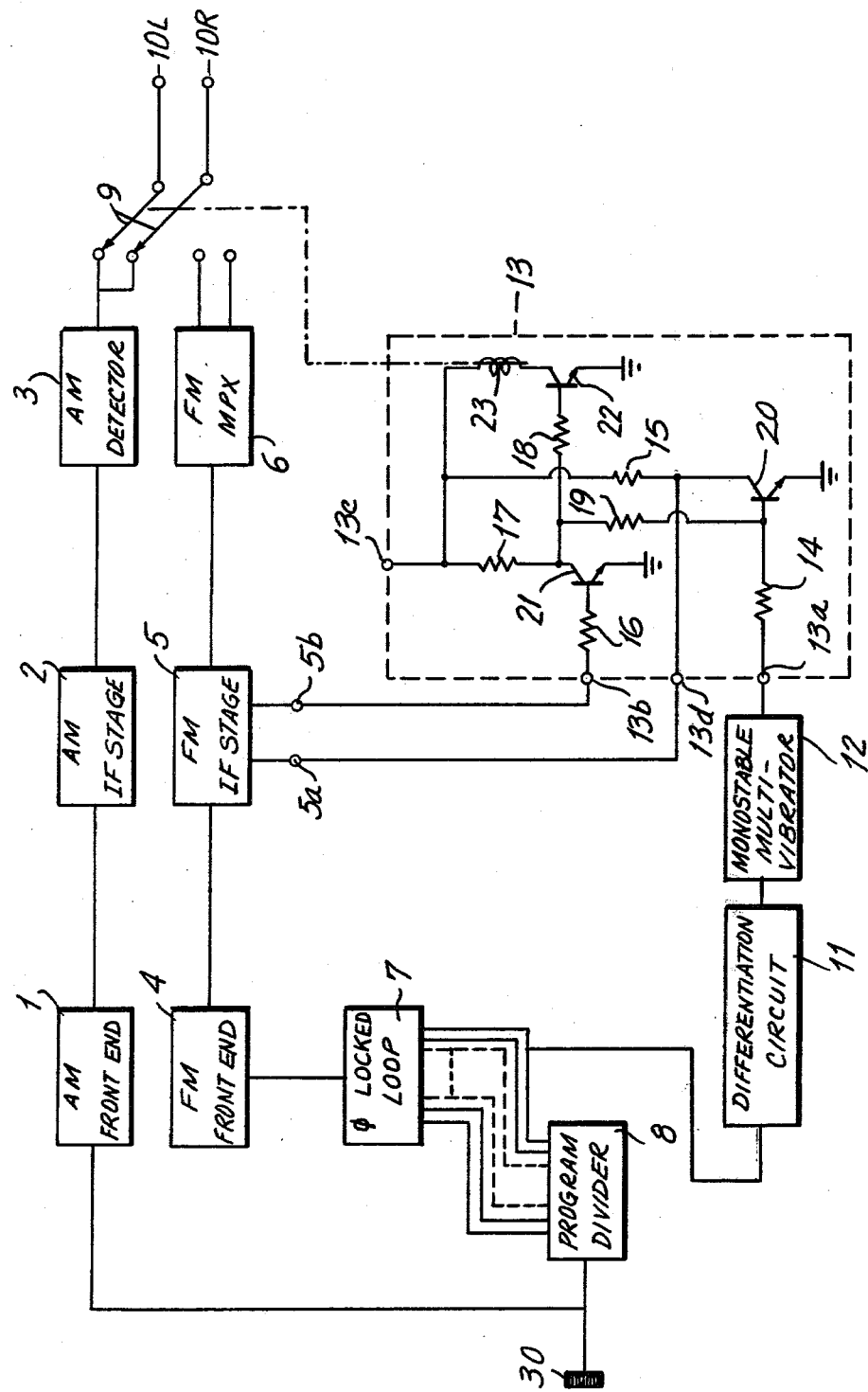
FIG. 1 is a partial block, partial schematic diagram of one embodiment of the present invention.

Referring now to the drawings, wherein like reference numerals are used throughout, and in particular to FIG. 1, there is illustrated one embodiment of multi-band radio receiving apparatus which incorporates the present invention. For the purpose of simplification, the illustrated radio receiving apparatus is shown as including an AM processing channel and an FM processing channel, each being tunable over frequencies, such as broadcast frequencies, normally included in the AM and FM frequency bands, respectively. It should, however, be recognized that the radio receiving apparatus may be provided with additional signal processing channels associated with, for example, VHF, UHF, mobile, citizens band, and other broadcast frequencies, as desired. Also, the AM or FM processing channel may be replaced by one or more of such additional channels.

In FIG. 1, the AM channel is comprised of an AM front end stage 1, an AM IF stage 2, and an AM detecting stage 3. Front end stage 1 is coupled to a signal receiving device, such as an antenna, a transmission waveguide, or the like, and includes an RF amplifier and a tuner, as is conventional. The tuner may be of the air capacitor type or, alternatively, may include a voltage-controlled reactance, such as a variable capacitance diode, both devices having a variable reactive component which is adjustable by manual operation of a tuning knob 30. Thus, knob 30 may be mechanically connected directly to the air capacitor, or may be connected to a voltage generator, such as an adjustable potentiometer, for supplying a variable tuning voltage to the voltage-controlled reactance.

AM IF stage 2 is connected to front end stage 1 and is adapted to receive the IF signal produced at the output of the AM tuner included in the front end stage and to amplify this IF signal to a suitable level. As is known, the IF signal is an amplitude modulated signal of constant IF carrier frequency modulated with an information signal.

The output of IF stage 2 is connected to detector stage 3 which detects the amplitude modulations of the IF carrier frequency. Thus, detector stage 3 recovers the information signal which modulates the IF carrier. Consequently, the information signal derived at the output of the detector stage, that is, at the output of the AM channel, is the information signal which is broadcasted at the AM frequency to which front end stage 1 is tuned.

The FM processing channel includes an FM front end stage 4, and IF stage 5 and a multiplex stage 6, as is conventional. The FM processing channel also includes a detector, or discriminator stage which is provided between the IF stage and the multiplex stage. Hence, in the illustrated FM processing channel, this detector or discriminator stage preferably may be considered as being included in the output section of the IF stage but may be included in the input section of the multiplex stage. Front end section 4 includes an RF amplifier and a tuner including a mixer, as is conventional, for supplying a frequency modulated IF signal to IF stage 5. Preferably, the tuner is of the type which is provided with a voltage-controlled reactance, such as a variable capacitance diode, for determining the particular FM frequency to which the front end stage is tuned. Thus, the voltage-controlled reactance is included in a variable oscillator whose oscillating frequency is controlled to establish the tuning condition of front end stage 4.

In the embodiment shown in FIG. 1, the tuning section of front end stage 4 is of the so-called phase-locked loop (PLL) type. In the phase-locked loop tuner, a clock signal, such as produced by a voltage controlled oscillator, has its frequency divided by a controllable frequency dividing circuit. Depending upon the dividing ratio of the frequency dividing circuit, the frequency-divided clock signal differs from a reference signal which may be produced by a fixed oscillator, such as a crystal oscillator. Depending upon the difference between the frequency-divided clock signal and the constant reference signal, an error voltage is produced which is applied to the voltage-controlled reactance, thereby establishing the frequency of the local oscillator included in front end stage 4, and thus determining the tuning condition of the FM processing channel. The dividing radio of the frequency divider is established, or set, by a programmable divider 8. As shown, programmable divider 8 is coupled to phase-locked loop 7 so as to establish the dividing ratio of the frequency divider included in the phase-locked loop in accordance with a coded signal produced by the programmable divider. In this regard, programmable divider 8 is coupled to tuning knob 30 whereby the coded signal produced thereby is adjusted in accordance with the adjustment of the tuning knob. That is, as the tuning knob is manually operated, the coded control signal produced by programmable divider 8 correspondingly changes so as to change, in a related manner, the dividing ratio of the frequency divider included in the phase-locked loop.

In accordance with one aspect of the embodiment shown in FIG. 1, the knob 30 is mechanically coupled to the tuners included in both the AM and FM processing channels. As one example thereof, tuning knob 30 may be mechanically ganged to the variable air capacitor included in the AM tuner and to any suitable device which is effective to modify the code produced by programmable divider 8. Hence, as an operator adjusts the tuning knob so as to vary the tuning condition of the radio receiving apparatus, it is appreciated that both the AM tuner and the FM tuner have their respective tuning conditions changed. In the illustrated embodiment, the tuning condition of the FM processing channel is sampled only during a tuning adjustment operation to determine when the FM processing channel is tuned to a broadcast FM frequency. Also, during the tuning adjustment operation, the output of the FM processing channel is disabled, or rendered inoperative, except for such short sampling time intervals. By rendering the FM processing channel inoperative during the tuning adjustment operation, the aforementioned undesired deleterious influence of the FM processing channel on the tuning condition of the AM processing channel is avoided. The FM processing channel is disabled and then is intermittently activated or energized, and sampled during the tuning adjustment operation, by reason of a differentiation circuit 11, a monstable multivibrator 12 and a control circuit 13. Differentiation circuit 11 is coupled to a predetermined bit stage of programmable divider 8, such as the least significant bit of the programmable divider output code. It is appreciated that, as tuning knob 30 is adjusted so as to modify the tuning condition of the AM and FM tuners, the binary signal which occupies the least significant bit of the programmable divider output code will change intermittently between "0" and "1". Each of these transitions is differentiated by the differentiation circuit so as to supply a trigger pulse to monostable multivibrator 12 which is coupled thereto. As is conventional, the monstable multivibrator responds to each trigger pulse to generate an output pulse signal of predetermined duration, this duration being dependent upon the quasi-stable time constant of the monostable multivibrator.

Control circuit 13 is coupled to an enable input 5a of IF stage 5 and is adapted to response to each pulse produced by monostable multivibrator 12 to disable this IF stage. As an example, enable input 5a may be coupled to a transistor which, when conductive, supplies operating power to the IF stage and, when non-conductive, terminates this supply of operating power so as to disable the IF stage. As an alternative, enable input 5a may be coupled to a muting device which selectively mutes the operation of IF stage 5, thereby effectively disabling the operation of this stage. One of ordinary skill in the art will recognize that enable input 5a may be coupled to various other devices which selectively disable the operation of the IF stage.

Control circuit 13 also is coupled to a control output 5b of IF stage 5 for the purpose of detecting the presence of a control signal which is produced by the IF stage when the FM processing channel is tuned to a broadcast FM frequency. As is known, when a proper tuning condition of the FM processing channel is attained, that is, when the FM tuner is tuned to a broadcasted FM frequency, the frequency of the IF signal supplied to IF stage 5 is equal to a predetermined amount. A suitable discriminator, or frequency detector, produces an output signal representing this predetermined IF frequency. Hence, if the FM tuner is not tuned to a broadcast FM frequency, then this output signal, referred to herein as a control signal, is not produced. Consequently, the control signal is provided at control output 5b of IF stage 5 only when the FM tuner is tuned to a broadcast FM frequency. Control circuit 13 includes a control signal detector which detects this control signal.

As shown in FIG. 1, the output of the AM channel, that is, the output of AM detector stage 3, and the output of the FM channel, that is, the output of multiplex stage 6, are selectively connected to an output circuit, such as loudspeakers, or the like, by a change-over switch 9. In the interest of simplification, the output circuit is represented herein by terminals 10L and 10R. These terminals may be connected to a left speaker and to a right speaker, or left and right speaker drive circuits, respectively. Change-over switch 9 is illustrated as an electromechanical switch having a pair of movable contacts coupled to terminals 10L and 10R and adapted to be changed over simultaneously between the outputs of the AM and FM processing channels. The output of the AM processing channel is shown as a pair of fixed contacts, connected in common, and adapted to be provided with a monophonic information signal, such as a monophonic audio signal, derived by the AM processing channel from the AM signal received thereby. At the present time, a conventional AM broadcast signal is not capable of broadcasting stereophonic information. For this reason, only a monophonic signal is provided at the output of the AM processing channel. The output of the FM processing channel is shown as being coupled to a pair of terminals so as to provide left-channel and right-channel stereophonic information thereat. This stereophonic information, such as stereophonic audio signals, is selectively coupled to terminals 10L and 10R by change-over switch 9.

Control circuit 13 is adapted to selectively determine the condition of change-over switch 9. That is, when the FM processing channel is not tuned to a broadcast FM frequency, change-over switch 9 normally connects the AM processing channel to the output circuit depicted as terminals 10L and 10R. However, once the FM processing channel is tuned to an FM broadcast frequency, the change-over switch is operated to connect the FM processing channel to the output circuit.

As schematically illustrated in FIG. 1, control circuit 13 is comprised of transistors 20, 21 and 22, and a switch energizing coil 23. Transistor 20 has its base electrode coupled to terminal 13a by a resistor 14, this terminal being supplied with the output pulse produced by monostable multivibrator 12. The collector electrode of transistor 20 is coupled to a source of operating potential via a collector electrode 15. This source of operating potential is provided at a power supply terminal 13c. The collector electrode of this transistor additionally is coupled to terminal 13b which, in turn, is connected to enable input 5a of IF stage 5. The emitter electrode of transistor 20 is connected to a source of reference potential, such as ground.

Transistor 21 has its base electrode connected through a base resistor 16 to terminal 13b, this terminal being connected to control output 5b of IF stage 5. The collector electrode of transistor 21 is connected to power supply terminal 13c by a collector resistor 17 and, additionally, is connected by a resistor 19 to the base electrode of transistor 20. The emitter electrode of transistor 21 is connected to ground.

Transistor 22 has its collector electrode connected through energizing coil 23 to power supply terminal 13c, and has its emitter electrode connected to ground. The base electrode of this transistor is connected through a base resistor 18 to the collector electrode of transistor 21.

The manner in which control circuit 13 operates now will be described. Let it be assumed that the FM processing channel is not tuned to an FM broadcast frequency. Consequently, change-over switch 9 assumes an initial condition to connect the AM processing channel to terminals 10L and 10R. This means that the AM program which is received by the radio receiving apparatus is demodulated, and the derived information signal is supplied to the output circuit. Now, let is be assumed that an operator adjusts tuning knob 30. As mentioned above, adjustment of this tuning knob changes the tuning conditions of both the AM and FM tuners included in front end stages 1 and 4, respectively. As knob 30 is adjusted, the frequency dividing code produced by programmable divider 8 is modified. Consequently, differentiation circuit 11 is supplied with transition signals. These transitions are differentiated to trigger monostable multivibrator 12. Each pulse produced by the triggered monostable multivibrator turns ON transistor 20. When this transistor is turned ON, its collector voltage is reduced to a relatively low level. Hence, a relatively low level voltage is supplied to enable input 5a of IF stage 5. This low level voltage functions as an enable signal to render the IF stage operative for the duration of the pulse supplied to transistor 20 by monostable multivibrator 12.

When IF stage 5 is rendered operative, the tuning condition of the FM channel can be detected. That is, when the IF stage is operative, the level of the control signal produced thereby and provided at control output 5b can be detected. Let it be assumed that, during this initial adjustment of tuning knob 30, the FM processing channel is not yet tuned to an FM broadcast frequency. Hence, the control signal provided at control output 5b is of a relatively high level. This means that transistor 21 is rendered conductive, or turned ON, so as to decrease its collector voltage. With this decrease in the voltage at the collector electrode of transistor 21, transistor 22 remains OFF. As a consequence thereof, change-over switch 9 maintains the connection of the output of the AM processing channel to terminals 10L and 10R.

As tuning knob 30 is further adjusted, further transitions are supplied to differentiation circuit 11 which, in turn, continues to trigger monostable multivibrator 12. Hence, transistor 20 is turned On intermittently during this tuning adjustment operation. It is appreciated that, whenever transistor 20 is turned ON, IF stage 5 is rendered operative so that the tuning condition of the FM processing channel can be detected. Once the tuning condition of the FM processing channel is tuned to an FM broadcast frequency, the level of the control signal provided at control output 5b becomes relatively low. This turns OFF transistor 21 to result in a relatively high collector voltage at its collector electrode. This relatively high collector voltage turns ON transistor 22 to permit current to flow therethrough and, thus, through energizing coil 23. Therefore, change-over switch 9 is operated in response to the energized coil to connect the output of the FM processing channel to terminals 10L and 10R. That is, once the FM processing channel is tuned to a broadcast FM frequency, it is the FM processing channel which is connected to the output circuit.

Moreover, when transistor 21 is turned OFF, the relatively high level collector voltage thereof is supplied through resistor 19 to turn transistor 20 ON. Hence, an enable signal is supplied to enable input 5a of IF stage 5, thereby rendering the IF stage operative. This means that if the adjustment of tuning knob 30 is discontinued so as to discontinue the transitions supplied to differentiating circuit 11 and thus discontinue the further triggering of monostable multivibrator 12, a proper enable signal nevertheless will be supplied to IF stage 5 by transistor 20 to enable this stage to operate properly. By supplying this enable signal to the IF stage when a proper tuning condition is reached, the FM processing channel operates properly to receive and demodulate the information signal which is broadcasted at the selected FM frequency.

Resistors 14 and 19 are properly dimensioned, that is, their resistance values are suitably selected, such that a pulse produced by monostable multivibrator 12, although capable of turning transistor 20 ON, is substantially attenuated so as to be incapable of turning transistor 22 ON. Therefore, during the tuning adjustment operation when the tuning condition of IF stage 5 is intermittently sampled while tuning knob 30 is adjusted, change-over switch 9 maintains the connection between the AM processing channel and terminals 10L and 10R. Transistor 22 is not erroneously turned ON to change the condition of switch 9 so as to connect the FM processing channel to the output circuit.

From the foregoing, it may be appreciated that control circuit 13 functions to intermittently sample the tuning condition of the FM processing channel during a tuning adjustment operation by intermittently rendering IF stage 5 operative. The duration over which the IF stage operates during this sampling operation is determined by the width of each pulse produced by monostable multivibrator 12 and, therefore, is very short. Hence, during a tuning adjustment operation, the AM processing channel and the FM processing channel operate simultaneously only during very brief durations. Such brief durations avoid any deleterious influence of one channel upon the other. That is, since IF stage 5 in the FM processing channel is rendered operative only during brief sampling durations, it has no, or only negligible influence upon the operation of the AM processing channel.

Although the embodiment shown in FIG. 1 maintains the AM processing channel operative at all times and renders the FM processing channel operative only during brief sampling times during a tuning adjustment operation, it may be appreciated that, if desired, IF stage 2 in the AM processing channel may be rendered operative intermittently to have its tuning condition sampled during a tuning adjustment operation in a manner similar to the sampling operation performed with respect to the FM processing channel.

One advantage of the embodiment in FIG. 1 wherein the FM tuner is of the so-called PLL type is that a fine tuning operation is not needed for the FM tuner. That is, since the local frequency which is used in front end stage 4 to tune the FM processing channel to a selected FM broadcast frequency is synthesized by use of programmable divider 8 and phase-locked loop 7, local frequency drift is minimized sufficiently so as to obviate the need for additional fine tuning.

As mentioned above, IF stage 5 of the FM processing channel is of conventional construction and, accordingly, may be formed of integrated circuit (IC) construction or may be formed of discrete components. In either embodiment, the IF stage performs an IF amplification function, a signal limiting function, a detection function, such as quadrature detection, an audio preamplification function and, if desired, an output muting function, the latter being related to the level of the control signal provided at control output 5b. That is, as the control signal level increases, indicating that the FM tuner is not tuned properly to an FM broadcast frequency, the muting function is performed and, as mentioned above, transistor 21 included in control circuit 13 is turned ON. When the FM processing channel is tuned to an FM broadcast frequency, the control signal level is reduced and the muting operation is not performed. Also, transistor 21 is turned OFF to turn ON transistors 20 and 22, thereby enabling the continued operation of IF stage 5 while changing over switch 9 to connect the FM processing channel to terminals 10L and 10R.

Figure 2:
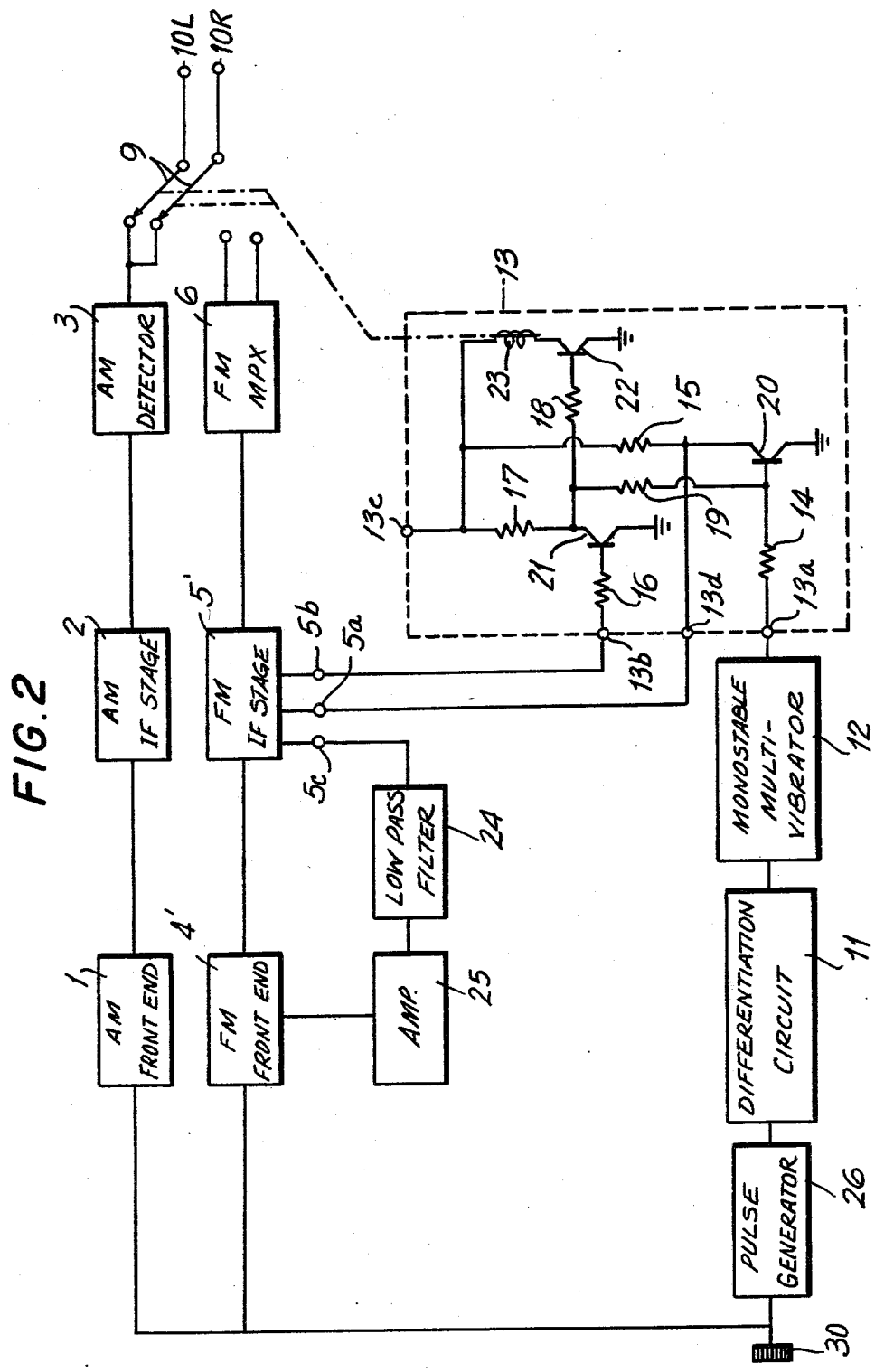
FIG. 2 is a partial block, partial schematic diagram of another embodiment of the present invention.

In the embodiment shown in FIG. 1, control circuit 13 is used in conjunction with an FM processing channel having a PLL-type FM tuner. Reference now is made to FIG. 2 which illustrates another embodiment of the present invention wherein control circuit 13 is used in conjunction with an FM tuner having an automatic frequency control (AFC) circuit. This AFC-type tuner also is known as a servo-controlled tuner. In FIG. 2, the same elements which have been shown in FIG. 1 are identified with the same reference numerals and, in the interest of brevity, further description thereof is not provided. The FM processing channel in FIG. 2 includes a front end stage 4' having the AFC-type FM tuner and an IF stage 5', the latter differing from IF stage 5 (FIG. 1) in that it includes a feedback terminal 5c for feeding back a discriminator output signal to the tuning servo loop which is connected to the AFC-type FM tuner. IF stage 5' also includes enable input 5a and control output 5b, which have been described above with respect to the embodiment shown in FIG. 1.

The FM tuner includes a variable capacitive device, such as a variable air capacitor, included in the local oscillator so as to vary the frequency of the local oscillating signal, and thereby tune the FM tuner to a selected FM broadcast frequency. This variable capacitive device is shown as being mechanically linked to tuning knob 30. In addition, an AFC loop, or servo feedback circuit, is provided between feedback terminal 5c of IF stage 5' and the local oscillator included in the FM tuner of front end stage 4'. This AFC loop includes a low pass filter 24 and an amplifier, such as an operational amplifier 25. As is conventional, the level of the discriminator signal provided at feedback terminal 5c changes as the local oscillating frequency changes. This discriminating signal is fed back to the local oscillator so as to adjust its frequency, thereby compensating any frequency drift or frequency differential with respect to a proper FM broadcast frequency. Hence, this AFC feedback circuit serves to stabilize the tuning condition of the FM tuner.

Tuning knob 30 additionally is mechanically coupled to a pulse generator 26 which may comprise a conventional pulse generating circuit to supply pulses to differentiating circuit 11 when the tuning knob is adjusted. Thus, during a tuning adjustment operation, as the tuning conditions of the AM and FM processing channels are changed, pulse generator 26 supplies pulses to differentiating circuit 11 which operates in the same manner as discussed above. Thus, the pulse generator shown in FIG. 2 performs the same function as the least significant bit of programmable divider 8 in FIG. 1. As one example thereof, the pulse generator may comprise a light source in combination with an apertured or shutter disc, the disc being movable with respect to the light source when tuning knob 30 is adjusted so as to interrupt light from the source which impinges upon a photodetector, thereby generating pulses. Other embodiments of comparable pulse generating circuitry will be recognized by those of ordinary skill in the art.

The operation of the embodiment shown in FIG. 2 is substantially the same as the aforedescribed operation mentioned above with respect to the embodiment shown in FIG. 1. Thus, as tuning knob 30 is adjusted to change the tuning conditions of the AM and FM processing channels, transistor 20 is intermittently turned ON to render IF stage 5' operative, and thereby sample the tuning condition of the FM processing channel. During this tuning adjustment operation, when the FM processing channel is tuned to an FM broadcast frequency, the control signal provided at control output 5b is reduced to a relatively low level, thereby turning OFF transistor 21. This, in turn, turns ON transistors 20 and 22 so as to maintain the IF stage in its operative condition and, in addition, to change over switch 9 so as to connect the FM processing channel to terminals 10L and 10R. In the absence of a proper tuning condition of the FM processing channel, either during a tuning adjustment operation or when the AM processing channel is tuned to an AM broadcast frequency, the control signal provided at control output 5b is of a relatively high level so as to turn ON transistor 21. This maintains transistors 20 and 22 nonconductive so as to disable the IF stage and control switch 9 maintains the connection between the AM processing channel and the output circuit.

While the present invention has been particularly shown and described with respect to preferred embodiments thereof, it will be readily apparent to those of ordinary skill in the art that various changes and modifications in form and details may be made without departing from the spirit and scope of the invention. Thus, it is appreciated that additional signal processing channels associated with different frequency bands can be provided in the radio receiving apparatus. With such additional signal processing channels, control circuit 13 may be provided with additional transistors, similar to transistors 20–22, for intermittently sampling the tuning conditions of such additional signal processing channels during a tuning adjustment operation. Depending upon the detected tuning conditions of such channels, change-over switch 9 will be operated to connect that processing channel which is tuned to a broadcast frequency to the output circuit. As another modification, change-over switch 9 may be provided with quiescent contacts which are disconnected from any of the signal processing channels. During the tuning adjustment operation, change-over switch 9 may connect these quiescent contacts to the output circuit. Once a proper tuning condition of a signal processing channel is detected, the change-over switch then will be operated to connect that one signal processing channel to the output circuit. In yet another alternative modification, change-over switch 9 may comprise a solid-state, or transistor switching arrangement for selectively connecting one of the signal processing channels to the output circuit depending upon which signal processing channel is tuned to a proper frequency.

It is intended that the appended claims be interpreted as including the foregoing as well as other such changes and modifications.

What is claimed is:

1. Radio receiving apparatus for receiving signals in plural frequency bands, comprising:
   plural signal processing channels, each associated with a respective frequency band and each tunable